United States Patent
Heyman et al.

(10) Patent No.: US 11,093,342 B1
(45) Date of Patent: Aug. 17, 2021

(54) EFFICIENT DEDUPLICATION OF COMPRESSED FILES

(71) Applicant: EMC IP Holding Company LLC, Hopkinton, MA (US)

(72) Inventors: Jerrold Heyman, Chapel Hill, NC (US); Benjamin Whetstone, Cary, NC (US); Robert Fair, Cary, NC (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 442 days.

(21) Appl. No.: 15/721,562

(22) Filed: Sep. 29, 2017

(51) Int. Cl.
*G06F 11/14* (2006.01)
*G06F 3/06* (2006.01)
*G06F 16/174* (2019.01)
*H03M 7/30* (2006.01)

(52) U.S. Cl.
CPC ........ *G06F 11/1453* (2013.01); *G06F 3/0608* (2013.01); *G06F 3/0641* (2013.01); *G06F 11/1435* (2013.01); *G06F 16/1748* (2019.01); *H03M 7/3064* (2013.01)

(58) Field of Classification Search
USPC ........................................................ 707/692
See application file for complete search history.

(56) References Cited

U.S. PATENT DOCUMENTS

| | | | | |
|---|---|---|---|---|
| 7,526,607 B1* | 4/2009 | Singh | ............ | G06F 12/0804 |
| | | | | 711/118 |
| 8,122,196 B2* | 2/2012 | Chang | ............ | G06F 21/602 |
| | | | | 711/137 |
| 8,396,841 B1* | 3/2013 | Janakiraman | ........... | G06F 3/067 |
| | | | | 707/692 |
| 9,411,815 B1* | 8/2016 | Lu | ............ | G06F 11/1453 |
| 9,843,802 B1* | 12/2017 | Wallace | ............ | H04N 19/10 |
| 10,346,076 B1* | 7/2019 | Jonnala | ............ | G06F 3/0641 |
| 10,382,751 B1* | 8/2019 | Zhao | ............ | H04N 19/105 |
| 2009/0013129 A1* | 1/2009 | Bondurant | ............ | G06F 3/0608 |
| | | | | 711/115 |
| 2009/0268903 A1* | 10/2009 | Bojinov | ............ | G06F 11/1453 |
| | | | | 380/45 |
| 2009/0319534 A1* | 12/2009 | Gokhale | ............ | G06F 16/1748 |
| 2011/0060882 A1* | 3/2011 | Efstathopoulos | ..... | G06F 3/0613 |
| | | | | 711/162 |

(Continued)

*Primary Examiner* — Cam Linh T Nguyen
(74) *Attorney, Agent, or Firm* — Womble Bond Dickinson (US) LLP

(57) ABSTRACT

The present disclosure describes a technique for performing an efficient deduplication of compressed source data. The techniques may reduce the required storage footprint required for deduplication of compressed data. In order to reduce the storage size required, the system may perform additional decompression/recompression processes by identifying particular compression algorithms used by a source storage system. Once the compression algorithm is identified, the system may initiate decompression and then perform fingerprint analysis of the segment in the file of the uncompressed data. When a recovery process is initiated, the system may recompress the deduplicated data using the same compression algorithm used by the source storage system. Accordingly, the data recovery process may be performed in manner in which the client device receives restored data as expected and in the original compression format.

20 Claims, 5 Drawing Sheets

(56) References Cited

U.S. PATENT DOCUMENTS

| | | | |
|---|---|---|---|
| 2011/0125722 A1* | 5/2011 | Rao | G06F 16/1744 |
| | | | 707/693 |
| 2014/0281514 A1* | 9/2014 | Erofeev | H04L 9/088 |
| | | | 713/165 |
| 2016/0004598 A1* | 1/2016 | Lillibridge | G06F 11/1448 |
| | | | 707/654 |
| 2016/0162364 A1* | 6/2016 | Mutha | G06F 11/3476 |
| | | | 707/645 |
| 2016/0162374 A1* | 6/2016 | Mutha | G06F 11/3442 |
| | | | 714/19 |
| 2016/0299818 A1* | 10/2016 | Vijayan | G06F 16/113 |
| 2018/0032261 A1* | 2/2018 | Singhai | G06F 3/0608 |
| 2018/0081561 A1* | 3/2018 | Todd | G06F 11/1453 |
| 2018/0309841 A1* | 10/2018 | Hochberg | H04L 67/2828 |

* cited by examiner

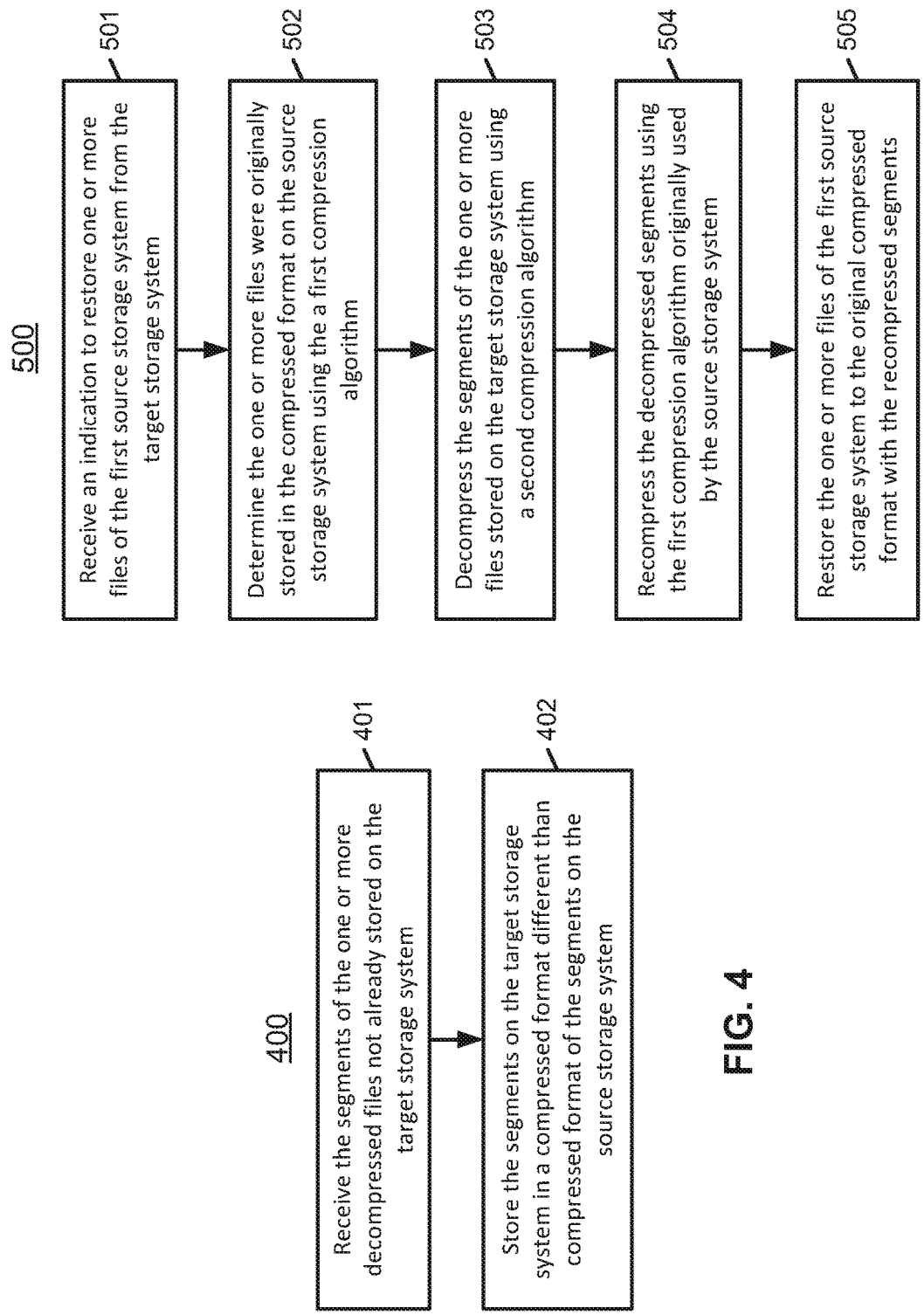

US 11,093,342 B1

EFFICIENT DEDUPLICATION OF COMPRESSED FILES

TECHNICAL FIELD

Embodiments of the present disclosure generally relate to data storage systems. More particularly, embodiments of the disclosure relate to a system that provides an efficient mechanism for deduplicating compressed data.

BACKGROUND

Data backup and recovery systems often implement various techniques to increase performance and improve overall cost of implementations. For example, these systems often employ data deduplication services for disk backup, archiving, and disaster recovery of source data. When providing such services, these systems often use various applications to store, for example, data directly to a storage device in various configuration environments such as a remote server architecture or a directly attached storage device.

Client systems (e.g. source storage systems) increasingly employ data compression techniques when storing data locally (e.g. source data). However, when performing deduplication on compressed data, the efficiencies typically obtained from the deduplication may not be realized to the same extent as with the duplication of uncompressed data. For example, when using current approaches for deduplication of compressed files, systems may achieve a 50% reduction in storage size. This is significantly less than the 10x (or more) reduction in storage size typically achieved when performing the deduplication of uncompressed data. Accordingly, the storage footprint of the compressed data may not be reduced to a sufficient degree that warrants the cost of implementing a deduplication service or configuration for data backup and recovery. Thus, there is a continued need to improve deduplication efficiency in instances where source data employs some form of data compression.

BRIEF DESCRIPTION OF THE DRAWINGS

Embodiments of the disclosure are illustrated by way of example and not limitation in the figures of the accompanying drawings in which like references indicate similar elements.

FIG. 4 is a diagram illustrating an example process of processing the decompressed segments for deduplicated storage according to one embodiment of the disclosure.

FIG. 5 is a diagram illustrating an example process of restoring deduplicated data to the original compressed source format according to one embodiment of the disclosure.

DETAILED DESCRIPTION

According to some embodiments, described is a system (and method) that provides a technique for performing an efficient deduplication of compressed source data. In one embodiment, the mechanism reduces the required storage footprint required for deduplication of compressed data. In order to reduce the storage size required, the system may perform additional decompression/recompression processes by identifying a particular compression algorithm used by a source storage system (e.g. client). Once the compression algorithm is identified, the system may initiate decompression and then perform fingerprint analysis of segments of the decompressed file. Accordingly, the system may identify segments that are already stored by the data storage system. When a recovery process is initiated, the system may recompress the deduplicated data using the same compression algorithm used by the source storage system. Accordingly, the data recovery process may be performed in manner in which the client device receives restored data as expected and in the original compressed format.

It should be noted that various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "some embodiments," "one embodiment" or "an embodiment" means that a particular feature, structure, or characteristic described in conjunction with the embodiment can be included in at least one embodiment of the disclosure. The appearances of the phrase "embodiment" in various places in the specification do not necessarily all refer to the same embodiment.

Storage System Overview

Figure 1:
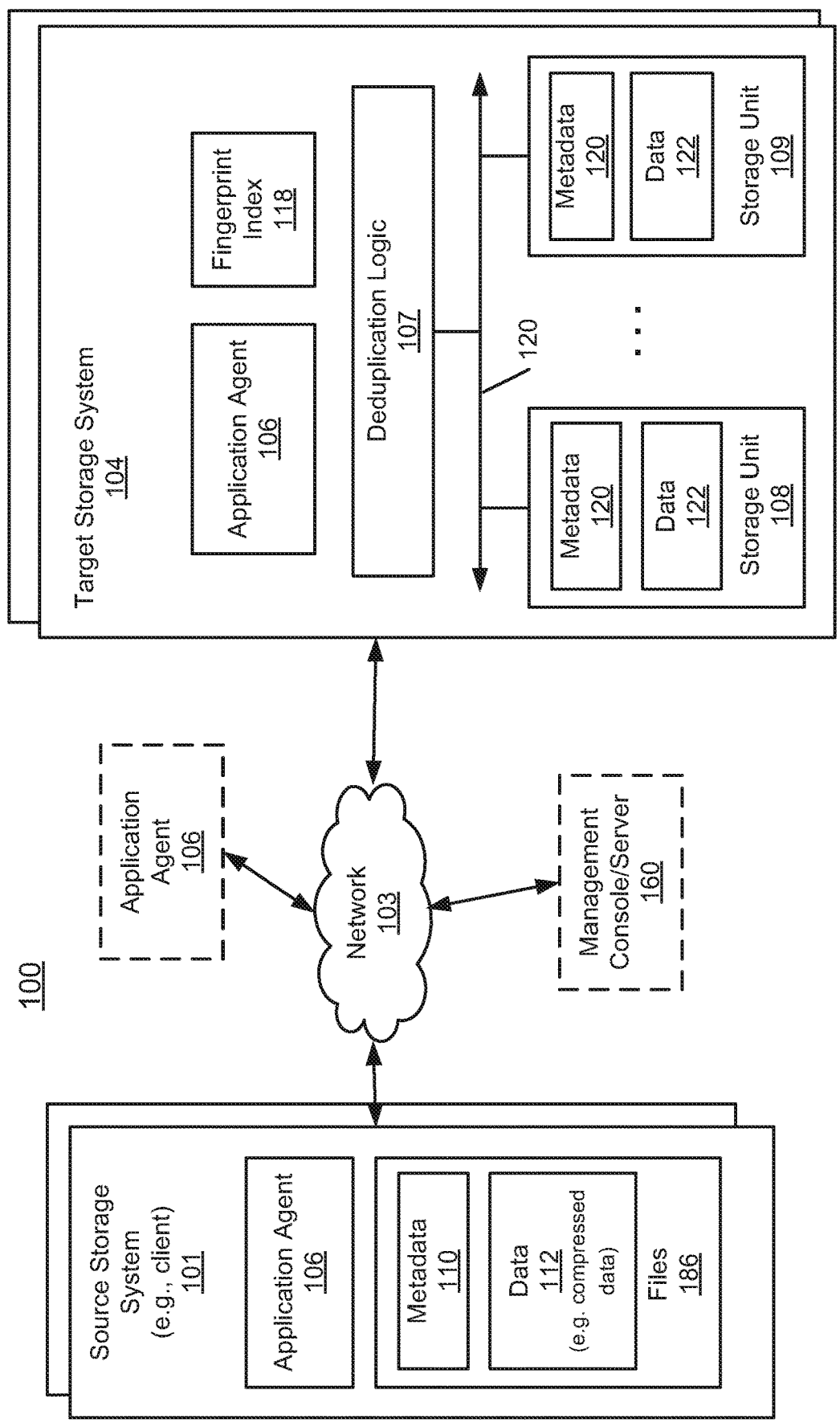
FIG. 1 is a block diagram illustrating a system configuration according to one embodiment of the disclosure.

FIG. 1 is a block diagram illustrating a system configuration 100 according to one embodiment of the disclosure. Referring to FIG. 1, configuration 100 includes, but is not limited to, one or more source storage systems 101 communicatively coupled to target storage system 104 over network 103. Source storage system 101 (e.g. client system) may be any type of system such as a host or server, a personal computer (e.g., desktops, laptops, and tablets), a "thin" client, a Web enabled appliance, a portable device (e.g., smartphone), or other form on computing device. In addition, the source storage system 101 may be a primary storage system (e.g., local data center) that provides storage to other local clients, which may periodically back up the content stored therein to a backup storage system (e.g., a disaster recovery site or system), such as target storage system 104.

The source storage system 101 may include one or more files 186 that include the data to be backed up to target storage system 104. In one embodiment, the data to be backed up includes metadata 110 and data 112. For example, files 186 may include metadata 110 stored as header information along with the data 112. In one embodiment, the files 186 may be compressed and/or encrypted. As further described herein, the metadata 110 (e.g. portion of a file) may include information related to a type of compression algorithm used to compress data 112 or files 186. In addition, the files may be part of a file system that includes one or more hard disk drives, solid state drives, or other storage devices, which may be arranged in logical, redundant storage containers (RAID). The files 186 may also be stored as part of a storage unit (e.g. storage unit 108-109).

As referred to herein, metadata (e.g. metadata 110 or 120) includes data associated with various attributes of the file, such as index information, file name/identifier, file location, file length, date stamp, permission, whether a file has been removed from the current file system, whether a file has been renamed, whether a file is compressed or encrypted, information regarding the compression algorithm used, etc.

In one embodiment, the files 186 may be virtual machine (VM) files that are the content files of one or more VMs. A virtual machine (VM) represents a completely isolated operating environment with a dedicated set of virtual resources associated with it. A virtual machine may be installed or launched as a guest operating system (OS) hosted by a host OS or a hypervisor. Typically, a host OS or hypervisor represents a virtual machine monitor (VMM) for managing the hosted virtual machines. A virtual machine can be any type of virtual machine, such as, for example, hardware emulation, full virtualization, para-virtualization, and operating system-level virtualization virtual machines.

Network 103 may be any type of networks such as a local area network (LAN), a wide area network (WAN) such as the Internet, a fiber network, a storage network, or a combination thereof, wired or wireless. Source storage system 101 may be in physical proximity or may be physically remote from one another.

Target storage system 104 may include or represent any type of server or a cluster of one or more servers (e.g., cloud servers). For example, target storage system 104 may be a storage server used for various different purposes, such as to provide multiple users or client systems with access to shared data and/or to back up (or restore) data (e.g., mission critical data). Target storage system 104 may provide storage services to clients or users via a variety of access interfaces and/or protocols such as file-based access protocols and block-based access protocols. For example, the file-based access protocols may include the network file system (NFS) protocol, common Internet file system (CIFS) protocol, and direct access file system protocol, etc. The block-based access protocols may include the small computer system interface (SCSI) protocols, Internet SCSI or iSCSI, and Fibre channel (FC) protocol, etc. Target storage system 104 may further provide storage services via an object-based protocol and Hadoop distributed file system (HDFS) protocol. The target storage system 104 (e.g. target storage system) may have a distributed architecture, or all of its components may be integrated into a single unit. The target storage system 104 may be implemented as part of an archive and/or backup storage system such as a deduplication storage system available from Dell EMC® of Hopkinton, Mass.

Storage units 108-109 may be implemented locally (e.g., single node operating environment) or remotely (e.g., multi-node operating environment) via interconnect 120, which may be a bus and/or a network (e.g., a storage network or a network similar to network 103). Storage units 108-109 may include a single storage device such as a hard disk, solid state drive (SSD), a tape drive, a semiconductor memory, multiple storage devices such as a redundant array system (e.g., a redundant array of independent disks (RAID)), a system for storage such as a library system or network attached storage system, or any other appropriate storage device or system. Some of storage units 108-109 may be located locally or remotely accessible over a network.

As described, the system may implement data deduplication. Accordingly, deduplication logic 107 may be configured to segment a data file into multiple segments (also referred to as chunks) according to a variety of segmentation policies or rules. Deduplication logic 107 may choose not to store a segment in a storage unit if the segment has been previously stored in the storage unit. In the event that deduplication logic 107 chooses not to store the segment in the storage unit, it stores metadata enabling the reconstruction of the file using the previously stored segment. As a result, segments of data files are stored in a deduplicated manner, either within each of storage units 108-109 or across at least some of storage units 108-109. Accordingly, a goal of deduplication logic 107 is to maintain only a single copy of each unique set of data within a data set. To achieve that goal, deduplication logic 107 may compute digests for data blocks. A digest is a representation of contents stored in a data block. Further, the digest is mathematically computed (e.g., MD5, SHA-1, SHA-2) in such a way that, computationally, there is a very low or zero probability of finding two data blocks that have the same digest but different contents. If the digest for the data block is sent together with the data block, a recipient of the data block can compute a new digest from the received data block and can compare the new digest with the received digest to determine whether the received data block is valid. Additionally, a digest is stored in an index table in order to process data blocks within the data set for deduplication. Further, a deduplication key identifying a data block is also stored in index table along with the digest for the data block. A deduplication key uniquely identifies a data block by storing information (such as logical address, physical address) of the data block. Deduplication logic 107 identifies data blocks that can potentially be deduplicated by comparing digests of data blocks with list of digests stored in the index table. Further, when data blocks are deduplicated after comparing digest information, deduplication logic 107 updates metadata (e.g. metadata 120) of deduplicated data blocks. Additionally, deduplication logic 107 updates metadata of a data block when the data block is reduplicated.

In one embodiment, source storage system 101 may also include deduplication logic having at least a portion of the functionalities of deduplication logic 107. Deduplication logic may be configured to perform local deduplication operations. For example, prior to transmitting data to target storage system 104, the deduplication logic may deduplicate the data into deduplicated segments and determine whether a particular deduplicated segment has already been stored on the target storage system 104. For example, when source storage system 101 is about to transmit a data stream (e.g., a file or a directory of one or more files) to target storage system 104, deduplication logic is configured to deduplicate the data stream into deduplicated segments. For each of the deduplicated segments, source storage system 101 transmits a fingerprint or a representative of the deduplicated segment to the target storage system 104 to determine whether that particular deduplicated segment has already been stored in the target storage system 104. In response to the target storage system 104 indicating that the segment has not been stored in the target storage system 104, that particular segment is then transmitted over to the target storage system 104. As a result, the network traffic or bandwidth and the processing resources required can be greatly reduced.

Returning to the target storage system 104, the system may also include metadata 120, which may be stored in at least some of the storage units 108-109, such that files can be accessed independent of another storage unit. Metadata 120 of each storage unit includes enough information regarding the file (as described above), for example, to provide access to the files it contains. For example, when performing a search for data, the system may access the metadata 120 to identify and locate the requested data (e.g. requested via a query). In one embodiment, metadata 120 may include fingerprints contained within data 122, where, for example, data 122 represents a data segment, a compression region (CR) of data segments, or a container of one or more CRs. Fingerprints are mapped to a particular data 122 via metadata 120, enabling the system to identify the location of the data 122 containing a segment represented by a particular fingerprint.

In one embodiment, the metadata 120 (including metadata 110) may include reconstruction information for the data 122 (or data 112) that may be segmented. In one embodiment, the metadata 120 may include information indicating the type of compression algorithm used to compress the data 122 (or data files). In one embodiment, a copy of the metadata 120 is stored for files stored on a first storage unit (e.g. storage unit 108) so that files that are stored on the storage unit can be accessed using only the information stored on the storage unit. In one embodiment, metadata 120 can be reconstructed by using information of other storage units associated with the storage system in the event that the main metadata 120 is lost, corrupted, damaged, etc. For example, metadata 120 for storage units (e.g. storage unit 108-109) may be reconstructed using metadata information stored on another storage unit (e.g. storage unit 109) or other type of storage unit (e.g. replica storage unit).

In one embodiment, the target storage system 104 may maintain a fingerprint index 118 (FP Index). Accordingly, the fingerprint index 118 may be used to deduplicate data stored in the storage units 108-109. In one embodiment the fingerprint index 118 is a partial index that covers a portion of data stored in the storage units 108-109, with the remainder of the fingerprint data stored in the metadata 120 of an associated one of the storage units 108-109.

The system may also include one or more application agents 106. The application agent 106 may represent any storage service related components configured or adapted to provide storage services to a variety of clients using any of the techniques described herein. As shown, in one embodiment, the application agent 106 may reside on a separate server (e.g. as a cloud-based service) from the source storage system 101 or target storage system 104. In addition, as shown, the application agent 106 may be part of target storage system 104, or may be part of source storage system 101.

The application agent 106 may perform various services such as, for example, a query service, a backup service, and restore service. Query service may be configured to receive a query from a client device (e.g. source storage system 101), and in response, initiate a search for data within the target storage system 104. In one embodiment, a search may be performed by accessing search data. In one embodiment, the search data may include metadata 120 to identify and locate information (e.g. data 122) requested by client device via the query. Backup service may be configured to receive and back up data from a client (e.g. source storage system 101) and to store the backup data in any one or more of storage units 108-109. Restore service may be configured to retrieve and restore backup data from any one or more of storage units 108-109 back to a client (e.g. source storage system 101). In one embodiment, the restore service may work in conjunction with the query service to identify and locate data that is to be restored. As referred to herein, a service (or agent) may include one or more processing modules (or logic, units, component, etc.), which may be implemented in software, hardware, or a combination thereof.

A storage manager or controller may be accessed by an administrator of management console or server 160 remotely via a management or configuration interface (not shown). The administrator can provision and manage storage resources based on a set of policies, rules, and/or service level agreements. The storage resources may be virtualized into a pool of virtual storage resources, where underlying physical storage resources represented by the corresponding virtual storage resources may be implemented locally, remotely (e.g., hosted by another storage system), or both. The virtual storage resources can be provisioned, allocated, and/or defined by an administrator or automatically by the storage manager based on a set of software-defined policies. The virtual storage resources may be represented in one or more virtual machines (e.g., virtual storage systems) managed by one or more virtual machine managers (VMMs). Each of the virtual machines can be provisioned to provide a particular type of storage services (e.g., file-based, block-based, object-based, or HDFS) to a client based on a storage policy or service level agreement associated with that particular client as part of software-defined storage services.

It should be noted that some or all of the components as shown and described above (e.g. of FIG. 1) may be implemented in software, hardware, or a combination thereof. For example, such components can be implemented as software installed and stored in a persistent storage device, which can be loaded and executed in a memory by a processor (not shown) to carry out the processes or methods described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Deduplication File System

Figure 2:
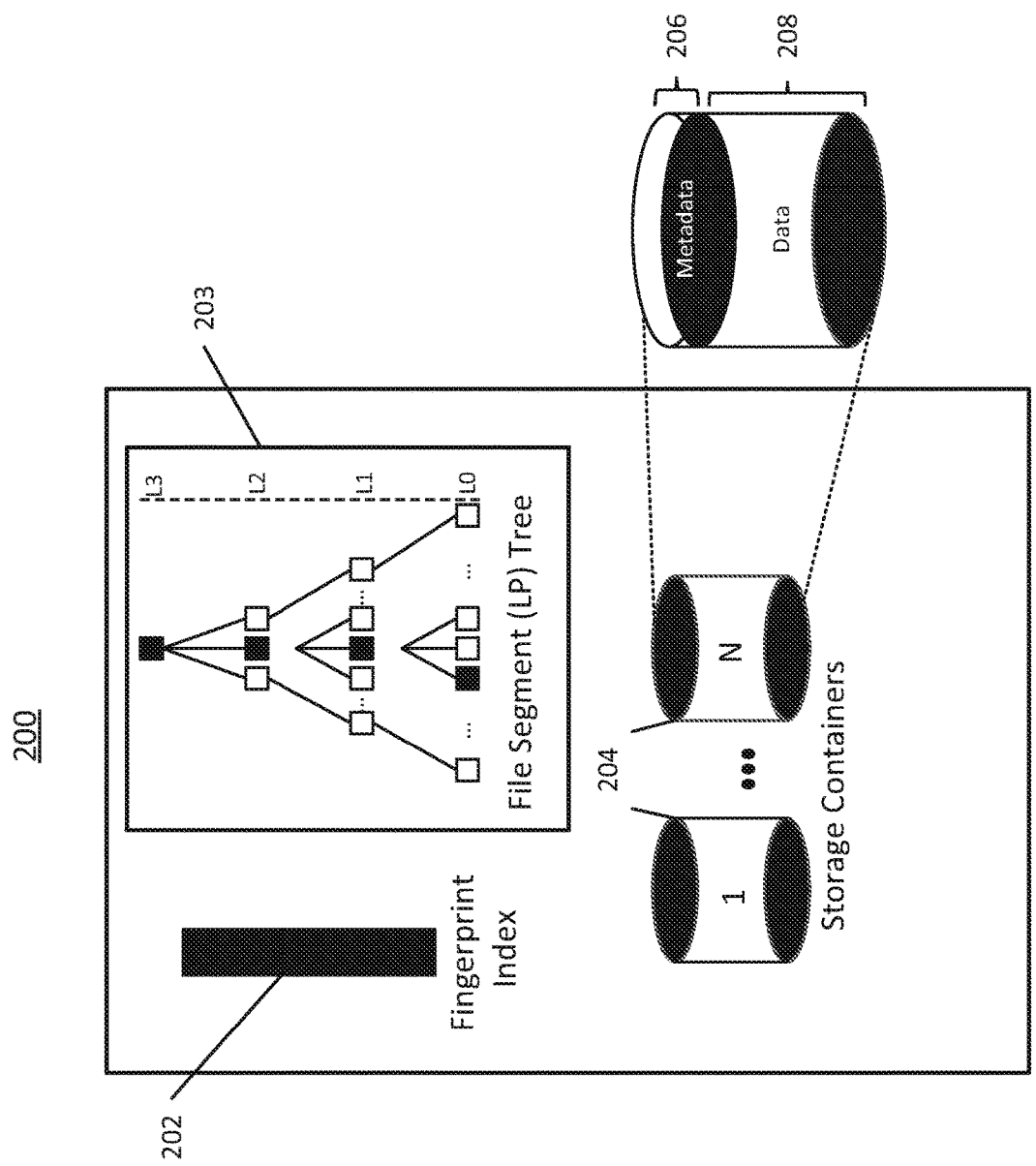
FIG. 2 is a diagram illustrating a deduplication file system according to one embodiment of the disclosure.

FIG. 2 illustrates an example deduplication file system 200 according to one embodiment of the disclosure. The deduplication file system includes a fingerprint index 202, a file segment tree 203, and one or more storage containers 204 including metadata 206 and data 208. In one embodiment, the fingerprint index 202 (e.g. fingerprint index 118) is a portion of the metadata 206 (e.g. metadata 120) on the storage containers 204 and at least a portion of the fingerprint index 202 is stored or cached in memory. The fingerprint index 202 stores information to determine which of the storage containers 204 on which data referenced by a fingerprint is stored. In one embodiment the fingerprint index 202 stores fingerprint data in the form of fingerprint and container identifier pairs (e.g., <FP,CID>) which associate a fingerprint with a container identifier storing the storage segment associated with the fingerprint.

The file segment tree 203 is a portion of the metadata 206 that enables the deduplication file system 200 to reconstruct a file from the underlying data 208. The file segment tree 203 may be referred to as an LP segment tree. In one embodiment the file segment tree 203 is a Merkle tree that may have multiple levels depending on the size of the file. The level zero (L0) segments of the tree are segments with user data. Each L0 segment is identified by a fingerprint, which is one of the fingerprints stored in the fingerprint index 202. The fingerprints are content based fingerprints, such as a hash of the L0 data segment. A level one (L1) segment references one or more L0 segments via content based fingerprints. One or more L1 segments can then be referenced by a level 2 (L2) segment, up to the root node of the tree. Accordingly, the L0 segments contain the data 208 within the storage containers 204. In some embodiments segments in layers L1 and up, referred to as LP segments are also stored in the data 208 and each LP segment also has an associated stored in the metadata 206 and in the fingerprint index 202. Segments can be shared among multiple files and in one embodiment may be compressed and packed within a compression region. Multiple compression regions may be packed into a storage container.

Efficient Deduplication of Compressed Files

As described above, the present disclosure describes a technique for performing an efficient deduplication of compressed source data. In one embodiment, the mechanism reduces the required storage footprint required for deduplication of compressed data. In order to reduce the storage size required, the system may perform additional decompression/recompression processes by identifying particular compression algorithms used by a source storage system (e.g. client system). Once the compression algorithm is identified, the system may initiate decompression and then perform fingerprint analysis of segments of the decompressed file. Accordingly, the system may identify segments that are already stored by the target storage system. When a recovery process is initiated, the system may recompress the deduplicated data using the same compression algorithm used by the source storage system. Accordingly, the data recovery process may be performed in manner in which the source storage system receives restored data as expected and in the original compressed format.

Figure 3:
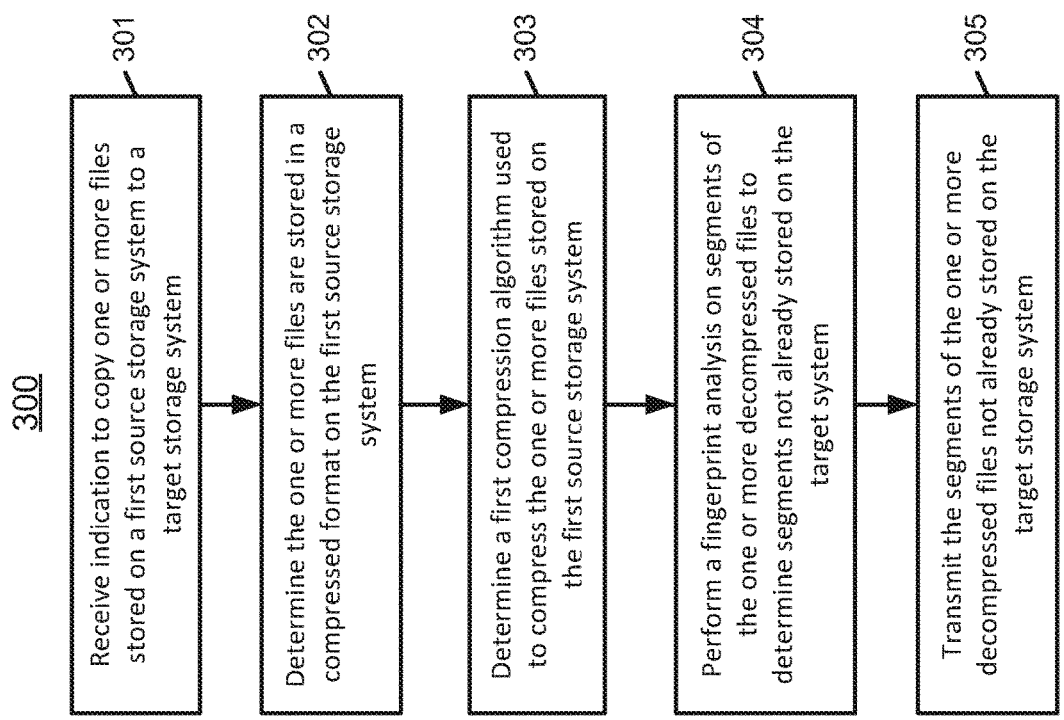
FIG. 3 is a diagram illustrating an example process of initiating deduplication of compressed data according to one embodiment of the disclosure.

FIG. 3 is a diagram illustrating an example process of initiating deduplication of compressed data according to one embodiment of the disclosure. Process 300 may be performed by a system (e.g. system 100, or source storage system 101, application agent 106, or target storage system 104).

As shown, in 301, the system may receive an indication to backup one or more files (e.g. files 186) that are stored on a source storage system (e.g. source storage system 101) to a target storage system (e.g. target storage system 104). As referred to herein, an indication to perform a "backup" may include various commands or procedures such as initiating a primary backup, redundant backup, replication, etc. Accordingly, the term backup may refer to various copy-type commands such a backup, replication, deduplicated storage, etc. In one embodiment, the indication to perform a backup may include initiating the deduplicated storage of the one or more files to the target storage system. In one embodiment, the indication may be provided by the source storage system itself, for example, working in conjunction with an application (e.g. application agent 106) that may be part of the source storage system. For example, the source storage system (e.g. client) may access a shared library provided by a service provider of deduplicated storage services (e.g. service provided by the target storage system) to initiate a backup. In another embodiment, the indication to perform a backup may be initiated by the target storage system. For example, the target storage system may transmit a command to the source storage system to initiate the deduplicated storage of one or more files. In yet another embodiment, the application agent (e.g. application agent 106) may initiate the deduplicated storage from a server or separate device than that of the source storage system or the target storage system.

In 302, the system may determine the one or more files are stored in a compressed format on the first source storage system. For example, clients of a duplicated store service may store local data to be backed up in a compressed format. As described above, directly deduplicating compressed data may not sufficiently reduce the storage footprint requirements to efficiently store the backup data. Accordingly, the system may initiate a decompression. In one embodiment, system may determine the one or more files are stored in a compressed format in response to receiving the indication to backup (or replicate etc.) one or more files stored on a first source storage system to a target storage system (e.g. in response to the indication described in 301). In one embodiment, the system may maintain an index indicating which files are compressed and which compression algorithms are used. In addition, such an index may indicate which files are encrypted. It should be noted that such an index may be stored and/or maintained on the source storage system, by the application agent, or the target storage system.

In 303, the system may determine a first compression algorithm used to compress the one or more files stored on the first source storage system by analyzing metadata associated with the one or more files (e.g. metadata 110). For example, a compressed file may store information related to the compression algorithm used within the header of the file. Accordingly, the system may analyze such header information of the file to determine the type of compression used. It should be noted that the techniques of the present disclosure may be used in conjunction with any suitable types of compression algorithms (e.g. lossless: Lempel-Ziv (LZ), DEFLATE, PKZIP, Gzip, etc; delta encoding: a reference to a chunk plus a difference; etc.). For example, the target storage system, source storage system, or application agent may maintain a shared library of compression algorithms that may be used for decompression. Accordingly, such algorithms may be referenced when performing decompression and recompression of data as described herein. In one embodiment, the metadata may also be may be stored separately from the files. For example, compression information may be stored in a table, index, or additional files maintained by the source storage system, application agent, or target storage system.

In 304, the system may perform a fingerprint analysis on segments of the one or more files that are now decompressed. In one embodiment, the fingerprint analysis may include comparing the fingerprints of the segments of the one or more decompressed files with a fingerprint index (e.g. fingerprint index 118) associated with the target storage system. For example, the fingerprint index may be maintained by the target storage system for segments that are already stored in a deduplicated manner as described above.

In 305, the system may transmit, to the target storage system, the segments of the one or more decompressed files not already stored on the target storage system. As described above, the system may perform a fingerprint analysis, and accordingly, may transmit only those segments required for deduplicated storage.

In one embodiment, the decompression may be performed on the source storage system, and thus, reduce transmission bandwidth requirements by sending only the segments required for deduplicated storage. In one embodiment, the compressed files, or a portion thereof, may be transmitted to the storage system or an intermediary device on which decompression may be performed. Accordingly, such a configuration may reduce the processing resources (e.g. CPU usage) required by the source storage system. It addition, various rules or policies may be utilized when performing a decompression. For example, in anticipation of backing up files, the decompression may be scheduled (e.g. by a scheduler) to efficiently allocate processing resources. In one embodiment, the decompression may be scheduled based on determining when processing usage drops below a predefined threshold. Accordingly, the decompression may be performed in response to initiating a backup process, or prior to initiating a backup process (e.g. in anticipation of a backup process).

FIG. 4 is a diagram illustrating an example of processing the decompressed segments for deduplicated storage according to one embodiment of the disclosure. Process 400 may be performed by a system (e.g. target storage system 104, application agent 106, or source storage system 101).

In 401, the system may receive the segments of the one or more decompressed files not already stored on the target storage system. For example, the target storage system may receive the decompressed segments from the source storage system. Once the segments are received, the target storage system may then store the segments in a deduplicated manner as described above.

In 402, the system may store the segments in a compressed format on the target storage system. In one embodiment, the target storage system may compress stored data using the same compression algorithm as the source data (e.g. files 186). Although the compression formats used by the source storage system and the target storage system may be the same, the system may still achieve an efficiency by reducing the storage footprint required for deduplicated storage of the decompressed version of the source data versus deduplicated storage of the compressed source data directly. Accordingly, the reduction in storage footprint warrants the increase in processing resources required for performing the additional decompression and recompression as described herein.

The target storage system may also perform compression/decompression that is specific to a particular client (e.g. customer). For example, the target storage system may receive data from a first source storage system that stores data using a first compression algorithm (e.g. PKZIP), and from a second source storage system that stores data using a second compression algorithm (e.g. Gzip). Accordingly, irrespective of the compression algorithm used by the particular source storage system, an initial decompression of the source data is performed (e.g. for fingerprint analysis) and a particular compression algorithm may be used when storing data to the target storage system. Accordingly, when performing a restore operation, the target storage system may recompress the data into the original compressed form according to the compression algorithm used for the particular source storage system (e.g. using PKZIP when performing a restore for the first source storage system, and using Gzip when performing a restore for the second source system).

In one embodiment, the particular compression algorithm used by the target storage system may be a different from the compression algorithm used to originally store the source data on the source storage system. For instance, using the example above, despite various source storage systems implementing various compression algorithms, the target storage system may implement a universal compression algorithm. In addition, in one embodiment, the target storage system may store data in a manner that is specific to the source storage system. Again, using the example above, the target storage system may compress data it obtains from the first source storage system using the first compression algorithm (e.g. PKZIP), and compress data it obtains from the second storage system using the second compression algorithm (e.g. Gzip). As described above, irrespective of the compression algorithms, the system may still achieve an efficiency by reducing the storage footprint by performing the initial decompression.

FIG. 5 is a diagram illustrating an example process of restoring the segments into the original compressed format according to one embodiment of the disclosure. Process 500 may be performed by a system (e.g. target storage system 104, application agent 106, or source storage system 101).

In 501, the system may receive an indication to restore one or more of the files stored on the target storage system. For example, as part of a recovery process (e.g. disaster recovery), the source storage system or application agent may initiate a restore process. Accordingly, the restore process may then be commenced by the target storage system.

In 502, the system (e.g. as part of the restore process) may determine that one or more files were originally stored in the compressed format on the source storage system. For example, the system may determine that the files to be restored were originally stored on the source storage system in a compressed format using a first compression algorithm as described above. In one embodiment, the system may determine the original compression format by accessing metadata (e.g. metadata 120) which may store information regarding the original compression format. For example, the system may store such information in the metadata at the time of performing an initial backup of data segments.

In 503, the system may decompress the segments of the one or more files to be restored. As described above, the system may use a second compression algorithm that is different than the compression algorithm used by the source storage system.

In 504, once the data segments are decompressed, the system may recompress the newly decompressed segments using the original compression algorithm (e.g. first compression algorithm) used by the source storage system.

In 505, the system may perform a restore of the one or more files to the source storage system in the original compressed format using the recompressed segments. Accordingly, a restoration is performed on the source storage system whereby the restored files are compressed in the original form. In one embodiment, the recompression may be performed on the target storage system or an intermediary system (e.g. intermediary server). For example, the recompression may first be performed on the target storage system to reduce the bandwidth requirements for transmission. Additionally, the recompression may be performed on the source storage system. For example, the target storage system may determine which data segments are necessary to be transmitted to the source storage system for the restore process. Once the source storage system obtains the required data segments, the system may initiate recompression of the data segments in the original compression format on the source storage system. In one embodiment, as part of a restore process, data on the source storage system may be decompressed and then combined with the obtained data segments. Accordingly, the restored data may then recompress all the data into the original format. In addition, recompression may be performed on a combination of the source storage system and the target storage system. For example, certain critical files such as system files may be prioritized during the restore process over the remaining files.

In one embodiment, the above techniques may also be performed with respect to encrypted data. Similar to compressed data, the storage footprint of encrypted data may not be reduced to a sufficient degree that warrants the cost of implementing a deduplication service or configuration for data backup and recovery. Accordingly, the above techniques may used in conjunction with encrypted data. For example, when a source storage system encrypts source data (e.g. local data), a decryption process may first be performed. For example, the system may receive an input such as a key in order to perform the decryption. In one embodiment, the information required to perform a decryption (e.g. key) may be via an input (e.g. entered by a user, or an input file) when initiating the backup process. For example, upon receiving an indication to commence a backup process, the system may first perform decryption, and then a decompression of source data stored on a source storage system. Similarly, in the event that data is not compressed but encrypted, the system may first perform a decryption process and then perform a fingerprint analysis as described above. In a similar manner as described above with respect to compression, the encryption/decryption may be performed on the source storage system, the target storage system, application agent, an intermediary server or device, or a combination thereof. For example, to reduce transmission bandwidth or to maintain security, decryption may be performed on the source storage system (or a trusted intermediary).

Accordingly, the techniques described herein provide an efficient mechanism to perform the deduplication of data even when the original source data is provided in a compressed format or encrypted format.

Figure 6:
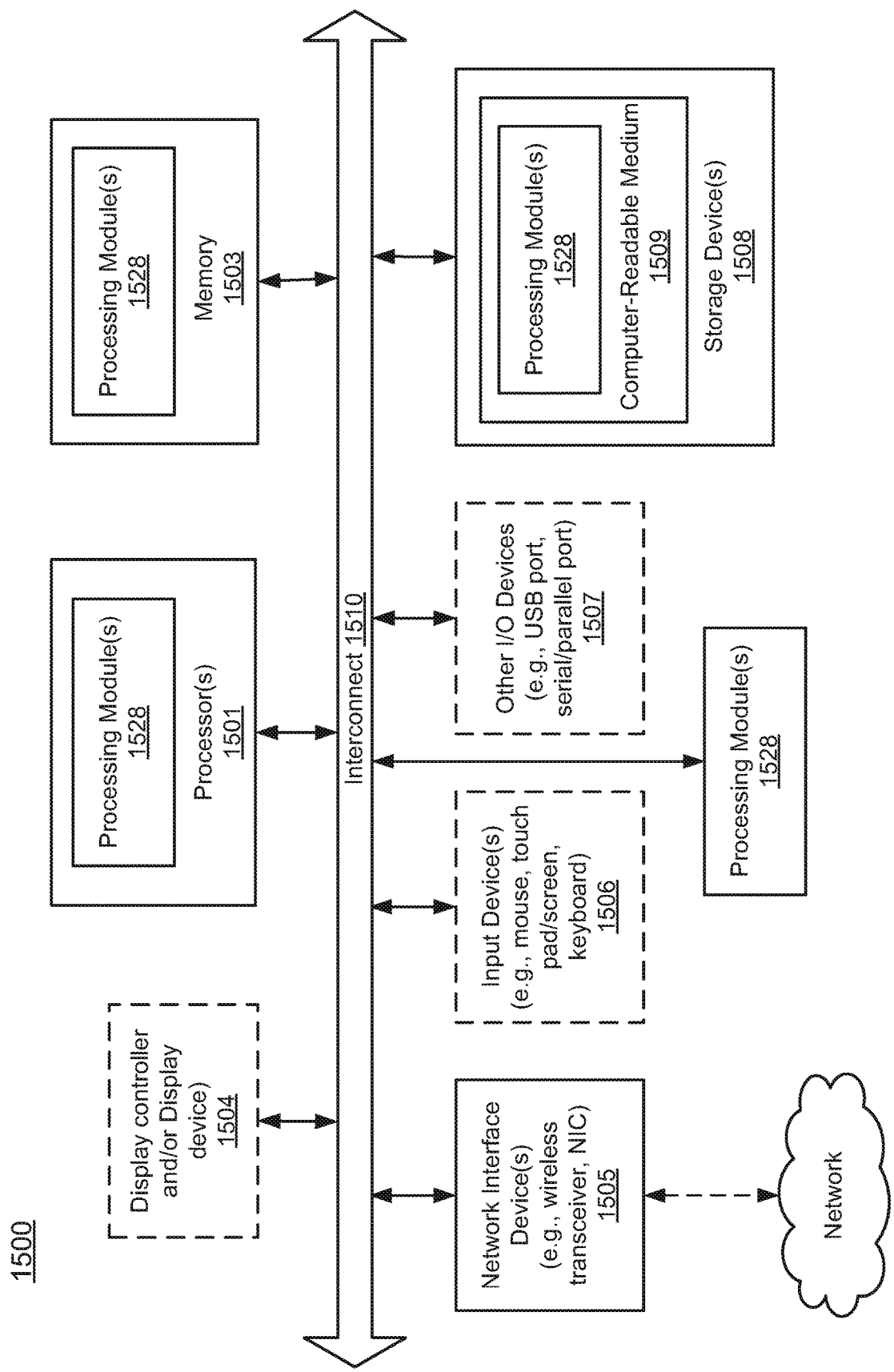
FIG. 6 is a block diagram illustrating an example computing system that may be used in conjunction with one or more embodiments of the disclosure.

FIG. 6 is a block diagram illustrating an example computing system that may be used in conjunction with one or more embodiments of the disclosure.

For example, system 1500 may represent any of data processing systems described above performing any of the processes or methods described above, such as, for example, one or more components shown in configuration 100 (e.g. system 100, clients 101, application agent 106, target storage system 104). System 1500 can include many different components. In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501 may be configured to execute instructions for performing the methods, processes, operations, functions, etc. as discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a touch pad, a touch sensitive screen (which may be integrated with display device 1504), a pointer device such as a stylus, and/or a keyboard (e.g., physical keyboard or a virtual keyboard displayed as part of a touch sensitive screen).

IO devices 1507 may include various electronic displays (e.g., a monitor having a screen, a small LCD touch-screen or any other electrical device that is operable to display information), audio output (such as speakers). Other IO devices 1507 may further include universal serial bus (USB) port(s), parallel port(s), serial port(s), a printer, a network interface, a bus bridge (e.g., a PCI-PCI bridge), or a combination thereof.

Storage device 1508 may include computer-readable storage medium 1509 (or machine-readable storage medium, computer-accessible medium, etc.) on which is stored one or more sets of instructions or software (e.g. processing modules 1528) embodying any one or more of the methods, processes, operations, functions, etc. as described herein.

Processing modules 1528 (or component/unit/logic) may represent any of the components of configuration 100, such as, for example, application agent 106, deduplication logic 107, etc. Processing modules 1528 may also reside, completely or at least partially, within memory 1503 and/or within processor 1501 during execution thereof by system 1500, memory 1503, and processor 150, which may also constitute a computer-readable storage medium. In addition, processing modules 1528 can be implemented as firmware or functional circuitry within hardware devices. Further, processing modules 1528 can be implemented in any combination hardware devices and software components.

Note that while system 1500 is illustrated with various components of a data processing system, it is not intended to represent any particular architecture or manner of interconnecting the components; as such details are not germane to embodiments of the present disclosure. It will also be appreciated that network computers, handheld computers, mobile phones, servers, and/or other data processing systems which have fewer components or perhaps more components may also be used with embodiments of the disclosure.

The processes or methods depicted in the preceding figures may be performed by processing logic that comprises hardware (e.g. circuitry, dedicated logic, etc.), firmware, software (e.g., embodied on a non-transitory computer-readable storage media), or a combination of both. Although the processes or methods are described above in terms of some sequential operations, it should be appreciated that some of the operations described may be performed in a different order. Moreover, some operations may be performed in parallel rather than sequentially.

The term "approximately" or "substantially" may be used herein and may be interpreted as "as nearly as practicable,"

"within technical limitations," and the like. In addition, the use of the term "or" indicates an inclusive "or" (e.g. "and/or") unless otherwise specified.

In the foregoing specification, example embodiments of the disclosure have been described. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of storing data within a storage system, comprising:
    in response to receiving an indication to backup one or more files stored on a first source storage system to a target storage system, determining that the one or more files are stored in a compressed format on the first source storage system using an index, wherein the index indicates which of the one or more files are compressed, the index being stored on the first source storage system and the target storage system, wherein the target storage system implements data deduplication, the indication being provided by the first source storage that works in conjunction with an application agent being a part of the first source storage system;
    determining a first compression algorithm used to compress the one or more files stored on the first source storage system by analyzing metadata associated with the one or more files;
    initiating a decompression using the determined first compression algorithm of the one or more files on the source storage system to create one or more decompressed files, wherein a library of compression algorithms including the first compression algorithm used for the decompression is shared by the source storage system, target storage system, and the application agent, wherein the decompression is scheduled based on determining when a Central Processing Unit (CPU) usage capacity drops below a predefined threshold;
    performing a fingerprint analysis on segments of the one or more created decompressed files to identify segments that are already stored by the target storage system based on the performed fingerprint analysis, wherein the fingerprint analysis includes comparing fingerprints of the segments of the one or more created decompressed files with a fingerprint index associated with the target storage system, wherein the fingerprint index is a portion of the metadata and at least a portion of the fingerprint index is stored or cached in a memory; and
    transmitting, to the target storage system, the segments of the one or more created decompressed files not already stored on the target storage system.

2. The method of claim 1, further comprising:
    in response to transmitting the segments of the one or more created decompressed files to the target storage system, initiating storage of the segments on the target storage system, wherein the segments are stored in a compressed format using a second compression algorithm.

3. The method of claim 2, wherein the second compression algorithm is different than the first compression algorithm.

4. The method of claim 3, further comprising:
    in response to receiving an indication to restore one or more files of the first source storage system stored on the target storage system, determining the one or more files were originally stored in the compressed format on the first source storage system using the first compression algorithm;
    decompressing the segments of the one or more files stored on the target storage system using the second compression algorithm;
    initiating a recompression of the decompressed segments using the first compression algorithm originally used by the source storage system; and
    restoring the one or more files of the first source storage system to the original compressed format with the recompressed segments.

5. The method of claim 4, further comprising:
    determining the first compression algorithm originally used by the source storage system by analyzing metadata stored during a storage process performed by the target storage system.

6. The method of claim 1, wherein the decompression of the one or more files is performed on the source storage system prior to transmitting segments of the one or more files to the target storage system.

7. The method of claim 4, wherein the recompression of the decompressed segments is performed on the target storage system prior to transmitting the segments to the source storage system for restoration.

8. The method of claim 1, further comprising:
    determining the one or more files stored on the first source storage system are encrypted; and
    in response to receiving an input to decrypt the one of more files, performing a decryption of the files prior to performing the fingerprint analysis on segments of the one or more files stored on the first source storage system.

9. A system, comprising:
    a memory storing instructions; and
    a processor coupled to the memory to execute the instructions from the memory, the processor being configured to perform operations, comprising:
    in response to receiving an indication to backup one or more files stored on a first source storage system to a target storage system, determining that the one or more files are stored in a compressed format on the first source storage system using an index, wherein the index indicates which of the one or more files are compressed, the index being stored on the first source storage system and the target storage system, wherein the target storage system implements data deduplication, the indication being provided by the first source storage that works in conjunction with an application agent being a part of the first source storage system;
    determining a first compression algorithm used to compress the one or more files stored on the first source storage system by analyzing metadata associated with the one or more files;
    initiating a decompression using the determined first compression algorithm of the one or more files on the source storage system to create one or more decompressed files, wherein a library of compression algorithms including the first compression algorithm used for the decompression is shared by the source storage system, target storage system, and the application agent, wherein the decompression is scheduled based on determining when a Central Processing Unit (CPU) usage capacity drops below a predefined threshold;
    performing a fingerprint analysis on segments of the one or more created decompressed files to identify segments that are already stored by the target storage system based on the performed fingerprint analysis, wherein the fingerprint analysis includes comparing fingerprints of the segments of the one or more created decompressed files with a fingerprint index associated with the target storage system; and transmitting, to the target storage system, the segments of the one or more created decompressed files not already stored on the target storage system.

10. The system of claim 9, the operations further comprising:

in response to transmitting the segments of the one or more created decompressed files to the target storage system, initiating storage of the segments on the target storage system, wherein the segments are stored in a compressed format using a second compression algorithm different than the first compression algorithm.

11. The system of claim 10, the operations further comprising:

in response to receiving an indication to restore one or more files of the first source storage system stored on the target storage system, determining the one or more files were originally stored in the compressed format on the first source storage system using the first compression algorithm;

decompressing the segments of the one or more files stored on the target storage system using the second compression algorithm;

initiating a recompression of the decompressed segments using the first compression algorithm originally used by the source storage system; and restoring the one or more files of the first source storage system to the original compressed format with the recompressed segments.

12. The system of claim 11, the operations further comprising:

determining the first compression algorithm originally used by the source storage system by analyzing metadata stored during a storage process performed by the target storage system.

13. The system of claim 9, wherein the decompression of the one or more files is performed on the source storage system prior to transmitting segments of the one or more files to the target storage system.

14. The system of claim 11, wherein the recompression of the decompressed segments is performed on the target storage system prior to transmitting the segments to the source storage system for restoration.

15. The system of claim 9, the operations further comprising:

determining the one or more files stored on the first source storage system are encrypted; and in response to receiving an input to decrypt the one of more files, performing a decryption of the files prior to performing the fingerprint analysis on segments of the one or more files stored on the first source storage system.

16. A non-transitory computer-readable medium storing instructions which, when executed by one or more processors, cause the one or more processors to perform operations, comprising:

in response to receiving an indication to backup one or more files stored on a first source storage system to a target storage system, determining that the one or more files are stored in a compressed format on the first source storage system using an index, wherein the index indicates which of the one or more files are compressed, the index being stored on the first source storage system and the target storage system, wherein the target storage system implements data deduplication, the indication being provided by the first source storage that works in conjunction with an application agent being a part of the first source storage system;

determining a first compression algorithm used to compress the one or more files stored on the first source storage system by analyzing metadata associated with the one or more files;

initiating a decompression using the determined first compression algorithm of the one or more files on the source storage system to create one or more decompressed files, wherein a library of compression algorithms including the first compression algorithm used for the decompression is shared by the source storage system, target storage system, and the application agent, wherein the decompression is scheduled based on determining when a Central Processing Unit (CPU) usage capacity drops below a predefined threshold;

performing a fingerprint analysis on segments of the one or more created decompressed files to identify segments that are already stored by the target storage system based on the performed fingerprint analysis, wherein the fingerprint analysis includes comparing fingerprints of the segments of the one or more created decompressed files with a fingerprint index associated with the target storage system; and transmitting, to the target storage system, the segments of the one or more created decompressed files not already stored on the target storage system.

17. The medium of claim 16, the operations further comprising:

in response to transmitting the segments of the one or more created decompressed files to the target storage system, initiating storage of the segments on the target storage system, wherein the segments are stored in a compressed format using a second compression algorithm different than the first compression algorithm.

18. The medium of claim 17, the operations further comprising:

in response to receiving an indication to restore one or more files of the first source storage system stored on the target storage system, determining the one or more files were originally stored in the compressed format on the first source storage system using the first compression algorithm;

decompressing the segments of the one or more files stored on the target storage system using the second compression algorithm;

initiating a recompression of the decompressed segments using the first compression algorithm originally used by the source storage system; and restoring the one or more files of the first source storage system to the original compressed format with the recompressed segments.

19. The medium of claim 16, wherein the decompression of the one or more files is performed on the source storage system prior to transmitting segments of the one or more files to the target storage system.

20. The medium of claim 18, wherein the recompression of the decompressed segments is performed on the target storage system prior to transmitting the segments to the source storage system for restoration.

* * * * *